US008239737B2

(12) United States Patent
Agarwal et al.

(10) Patent No.: US 8,239,737 B2
(45) Date of Patent: Aug. 7, 2012

(54) DATA LINE STORAGE AND TRANSMISSION UTILIZING BOTH ERROR CORRECTING CODE AND SYNCHRONIZATION INFORMATION

(75) Inventors: Rajat Agarwal, Beaverton, OR (US); C. Scott Huddleston, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 417 days.

(21) Appl. No.: 12/634,978

(22) Filed: Dec. 10, 2009

(65) Prior Publication Data
US 2011/0145678 A1 Jun. 16, 2011

(51) Int. Cl.
*H03M 13/00* (2006.01)
(52) U.S. Cl. ........................................................ 714/775
(58) Field of Classification Search .................. 714/775
See application file for complete search history.

(56) References Cited

U.S. PATENT DOCUMENTS

| | | | |
|---|---|---|---|
| 5,629,958 A | 5/1997 | Willming | |
| 5,818,853 A | 10/1998 | Nakano et al. | |
| 7,430,257 B1 * | 9/2008 | Shattil | 375/347 |
| 7,593,449 B2 * | 9/2009 | Shattil | 375/130 |
| 7,672,219 B2 * | 3/2010 | Geile | 370/207 |
| 7,965,761 B2 * | 6/2011 | Shattil | 375/147 |
| 2009/0024756 A1 * | 1/2009 | Spalla et al. | 709/231 |
| 2009/0199072 A1 * | 8/2009 | Akimov et al. | 714/758 |
| 2010/0289955 A1 * | 11/2010 | Kobayashi | 348/537 |
| 2010/0296562 A1 * | 11/2010 | Kobayashi et al. | 375/224 |
| 2011/0145678 A1 * | 6/2011 | Agarwal et al. | 714/763 |
| 2011/0293062 A1 * | 12/2011 | Lablans | 377/28 |

FOREIGN PATENT DOCUMENTS

| | | |
|---|---|---|
| KR | 10-1999-0082685 | 11/1999 |
| KR | 10-2008-0058507 | 6/2008 |

OTHER PUBLICATIONS

International Search Report and Written Opinion for Int'l Patent Application No. PCT/US2010/056145 mailed Jul. 28, 2011, 10 pgs.
Agarwal, Rajat et al., U.S Appl. No. 12/317,849, entitled, Poison Bit Error Checking Code Scheme, filed Dec. 29, 2008.

* cited by examiner

*Primary Examiner* — Amine Riad
(74) *Attorney, Agent, or Firm* — Blakely, Sokoloff, Taylor & Zafman LLP

(57) ABSTRACT

Methods and apparatuses for including synchronization data to be used for parallel processing in a block of data having error correcting code symbols. The block of data is encoded using an error correcting code. The resulting encoding includes three check symbols per 32 data symbols. At least one synchronization symbol corresponding to the data symbols is generated. The data symbols, the check symbols and the at least one synchronization symbol are combined. The combined data symbols, the check symbols and the at least one synchronization symbol are transmitted.

15 Claims, 4 Drawing Sheets

| DS0 | DS1 | ... | DS15 | CS0 | CS1 | DS16 | DS17 | ... | DS31 | CS2 | Synch |

Fig. 2

DATA LINE STORAGE AND TRANSMISSION UTILIZING BOTH ERROR CORRECTING CODE AND SYNCHRONIZATION INFORMATION

TECHNICAL FIELD

Embodiments of the invention relate to synchronization in highly-parallel systems. More particularly, embodiments of the invention relate to use of Error Correcting Code (ECC) symbols and synchronization symbols in a cache or data line within highly-parallel systems.

BACKGROUND

Parallel computation systems utilize multiple processing components to perform tasks in parallel. Many strategies and techniques have been developed to identify and coordinate this parallel processing functionality. Therefore, synchronization mechanisms are needed. However, current synchronization mechanisms may require specialized structures and operations, which may increase the complexity of the system and/or hinder overall system performance.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 2 is a logical layout of one embodiment of a cache line having ECC symbols and a synchronization symbol.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

Techniques, procedures and structures for including synchronization data to be used for parallel processing in a block of data having error correcting code symbols are described herein. The block of data is encoded using an error correcting code. In one embodiment, a modified Reed Solomon code is utilized. The resulting encoding includes three check symbols per 32 data symbols, which is less than the four check symbols per 32 data symbols of traditional Reed Solomon encoding.

At least one synchronization symbol corresponding to the data symbols is generated and stored in the block of data where the fourth symbol of traditional Reed Solomon encoding would otherwise be. The data symbols, the check symbols and the at least one synchronization symbol are combined, for example, into a cache line. The combined data symbols, check symbols and the at least one synchronization symbol are transmitted. The transmission may be, for example, between processors in a parallel processing environment.

Figure 1:
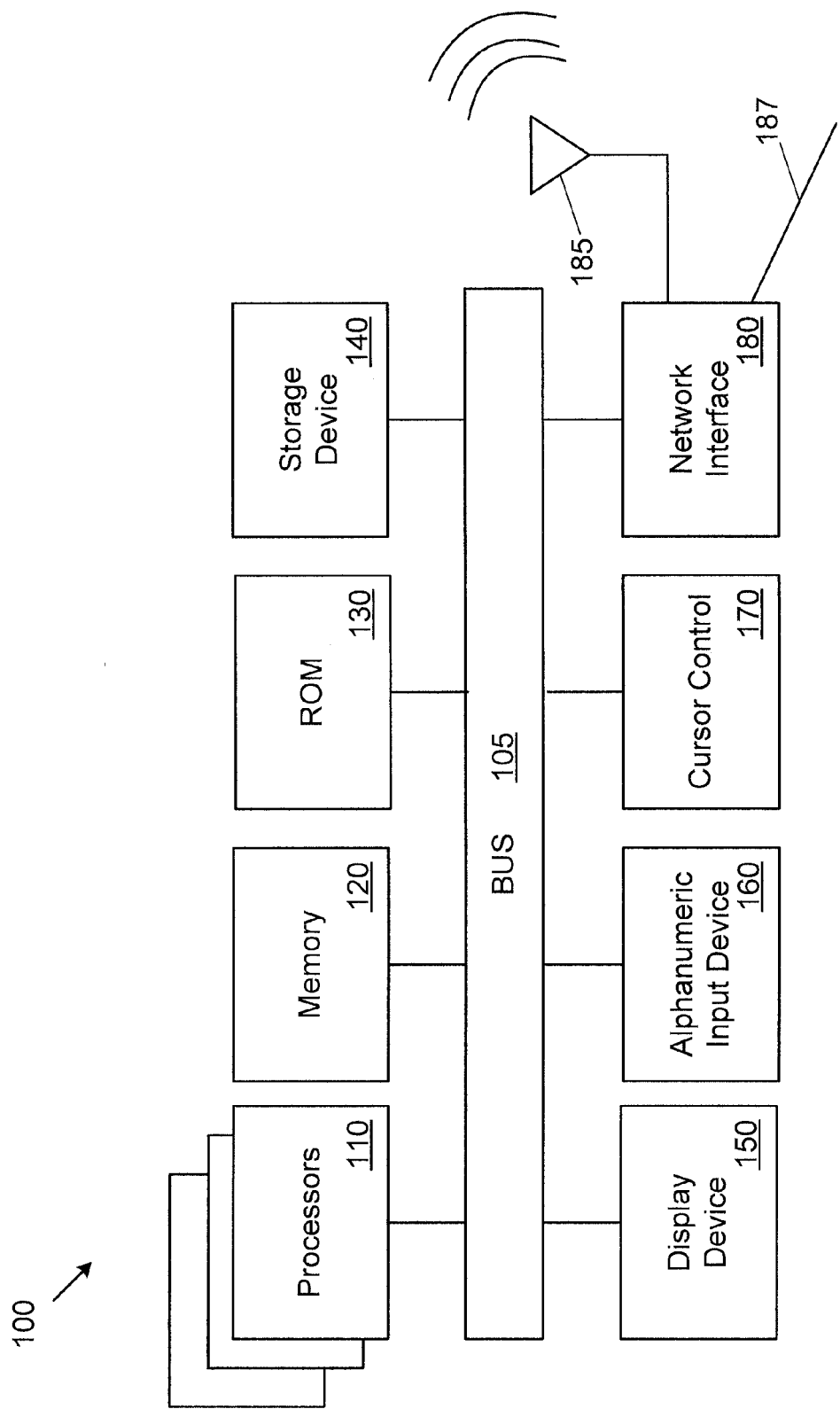
FIG. 1 is a block diagram of one embodiment of a parallel computing system.

FIG. 1 is a block diagram of one embodiment of a parallel computing system. The parallel computing system illustrated in FIG. 1 is intended to represent a range of parallel computing systems (e.g., multi-core systems, symmetric systems, asymmetric systems). Alternative parallel computing systems can include more, fewer and/or different components.

Because computer system 100 is a parallel computing system, processors 110 may operate on data in parallel. This parallel operation requires some mechanism to synchronize the results of these parallel operations. Computer system 100 also includes bus 105 or other communication device to communicate information, and processors 110 coupled to bus 105 to process information.

Computer system 100 further includes random access memory (RAM) or other dynamic storage device 120 (referred to as memory), coupled to bus 105 to store information and instructions to be executed by processors 110. Memory 120 also can be used to store temporary variables or other intermediate information during execution of instructions by processors 110. Some of all of memory 120 may be implemented as Dual Inline Memory Modules (DIMMs).

For some fine-grained parallel algorithms that operate on small (e.g., 4 byte) chunks of data, one synchronization bit per chunk may be sufficient. This additional synchronization, or tag, bit may be stored with the data in memory. However, many DIMMs do not have extra bits (besides the ECC bits) available to store this information with the data.

Described herein is an error correcting code (ECC)-based techniques that allow up to 16 synchronization bits to be stored per cache line. In one embodiment, these techniques may use a modified Reed Solomon algorithm, and "borrow" ECC check bit locations in the cache line to use for synchronization. In spite of the reduced number of bits available for ECC, correction capabilities of ECC are largely maintained. This enables the synchronization bits to be with the data chunks being operated on, and obviates the need for allocating additional memory and making additional memory accesses.

Computer system 100 also includes read only memory (ROM) and/or other static storage device 130 coupled to bus 105 to store static information and instructions for processor 110. Data storage device 140 is coupled to bus 105 to store information and instructions. Data storage device 140 such as a magnetic disk or optical disc and corresponding drive can be coupled to computer system 100.

Computer system 100 can also be coupled via bus 105 to display device 150, such as a cathode ray tube (CRT) or liquid crystal display (LCD), to display information to a user. Alphanumeric input device 160, including alphanumeric and other keys, is typically coupled to bus 105 to communicate information and command selections to processor 110. Another type of user input device is cursor control 170, such as a mouse, a trackball, or cursor direction keys to communicate direction information and command selections to processor 110 and to control cursor movement on display 150. Computer system 100 further includes network interface 180 to provide access to a network, such as a local area network.

Instructions are provided to memory from a storage device, such as magnetic disk, a read-only memory (ROM) integrated circuit, CD-ROM, DVD, via a remote connection (e.g., over a network via network interface 180) that is either wired (187) or wireless (185), etc. In alternative embodiments, hard-wired circuitry can be used in place of or in combination with software instructions. Thus, execution of sequences of instructions is not limited to any specific combination of hardware circuitry and software instructions.

A computer-readable medium includes any mechanism that provides content (e.g., computer executable instructions) in a form readable by an electronic device (e.g., a computer, a personal digital assistant, a cellular telephone). For example, a computer-readable medium may include read only memory (ROM); random access memory (RAM); magnetic disk storage media; optical storage media; flash memory devices; etc.

FIG. 2 is a logical layout of one embodiment of a cache line having ECC symbols and a synchronization symbol. In the illustration of FIG. 2 data symbols are designated by "DSn," where "n" indicates the data symbol number, ECC check symbols by "CSm," where "m" indicates the check symbol number, and the synchronization symbol by "Synch." In the example of FIG. 2, there are 32 data symbols, three ECC check symbols and one synchronization symbol.

Typical ECC DIMMs have one bit of ECC storage per byte. This gives 64 ECC check bits (8 bytes) per 64 byte cache line. Described in greater detail below is a technique to utilize a modified Reed Solomon code by, in one embodiment, using a 32-byte cache line based Reed Solomon code that works on 64-byte cache lines and changing the underlying finite fields.

Traditional Reed Solomon error decoding logic on 64-byte cache lines operates on four two-byte symbols, numbered 0 to 3, using a 4×36 H-matrix over $GF[2^{16}]$. This is capable of correcting simultaneous errors in any two-byte (16-bit) check symbol. Using traditional Reed Solomon operation, on a full cache line, each check symbol is 16 bits. In one embodiment, the technique described herein utilizes the storage location in the cache line that would be used by the 16 bits in the upper-most check symbol (number 3) to use as synchronization bits, and performs a modified Reed Solomon coding using only the three remaining check symbols (0 up to 2).

In one embodiment, the modified Reed Solomon code omits the final row and column of the H-matrix and computes check symbols 0 through 2 using a reduced 3×35 H-matrix. In one embodiment, check symbols 0 through 2 for the modified Reed Solomon code are the same as check symbols 0 through 2 for the traditional Reed Solomon code.

Use of these check bits come at the cost of modest loss in error correction capability—instead of correcting 100% of "chipkill" (failed device) errors, 99.997% to 99.9985% of chipkill errors may be corrected. Other chipkill errors become "detectable uncorrectable" errors (DUE rate 0.0015%–0.003%). The "silent data corruption" (SDC) rate from random large errors which miscorrect or go undetected is about 1 in 16.7 million. These SDC and DUE rates are very low and are acceptable for most systems.

Current techniques do not store the synchronization bits with the data. Rather, current techniques either store the information in additional separate memory in the DIMMs or in on-die buffers/caches. This requires additional memory capacity and bandwidth to achieve synchronization, or processor die area and power for larger buffers on processor die. Thus, use of the synchronization bits to be stored with the data chunks being operated on obviates the need for allocating additional memory and making additional memory accesses.

For a chipkill error affecting two data symbols $D_0$ and $D_1$, let $x_0$ and $x_1$ be the H-matrix column generators for $D_0$ and $D_1$. Then $x_0$ and $x_1$ are distinct nonzero elements of $GF[2^{16}]$, and the H-matrix columns are $[1=x_0^0, x_0=x_0^1, x_0^2]$ and $[1, x_1, x_1^2]$. A chipkill error with error $e_0$ on data symbol $D_0$ and error $e_1$ on $D_1$ will result in check symbols:

$$S_0 = e_0 + e_1$$

$$S_1 = e_0 * x_0 + e_1 * x_1$$

$$S_2 = e_0 * x_0^2 + e_1 * x_1^2$$

A "locator function" for chipkill errors on $D_0/D_1$, which is true exactly when check symbols $S_0$ through $S_2$ could be the result of a chipkill error on $D_0/D_1$, is:

$$S_0 * (x_0 * x_1) + S_1 * (x_0 + x_1) + S_2 = 0.$$

This locator function calculation is simplified with $x_1 = x_0 + 1$:

$$S_0 * x_0 * (x_0 + 1) + S_1 + S_2 = 0.$$

The error masks for $D_0/D_1$ chipkill errors are calculated by:

$$e_1 = S_0 * x_0 + S_1$$

$$e_0 = S_0 + e_1$$

For chipkill errors on ECC check symbols, $S_1$ and $S_2$ are mapped to lie in one device, so a chipkill error on that device could result in any values for $S_1$ and $S_2$. Then the locator function for $S_1/S_2$ chipkill errors is:

$$S_0 = 0.$$

The error masks $e_0/e_1$ for $S_1/S_2$ chipkill errors are calculated by:

$$e_0 = S_1$$

$$e_1 = S_2.$$

The techniques described herein can be applied with or without error correction/detection on the synchronization bits. Both variations are described, but only the variation without error coverage on synchronization bits is analyzed.

The final check symbol chipkill error is simply any error on $S_0$ and the synchronization bits. With no error coverage on the synchronization bits, this gives locator function:

$$S_1 = S_2 = 0$$

and error mask function:

$$e_0 = S_0.$$

Error coverage on the synchronization bits can be obtained by treating them as a data symbol, covered by an H-matrix column $[1, z, z^2]$ for nonzero z in $GF[2^{16}]$. With error coverage on synchronization bits, the $S_0$/synch chipkill error has locator function:

$$S_2 = S_1 * z$$

and error masks calculated by:

$$e_0 = S_0$$

$$e_1 = S_1 * (1/z).$$

In one embodiment, the modified Reed Solomon scheme calculates the locator functions for all possible chipkill errors. If exactly one locator function is true the error masks for that locator is calculated and that error is corrected. If there is no error then $S_0 = S_1 = S_2 = 0$ and every locator function is true. In all other cases (no true locator functions, or two or more true locator functions) some error occurred but there is either no possible correction as a chipkill error or no non-unique corrections possibilities for a chipkill error.

The following analysis is for when two or more locator functions can be simultaneously true, which determines the DUE rate. Note that data/data chipkill locators have the form:

$$S_0 * x * (x+1) + S_1 + S_2 = 0,$$

or equivalently, $$S_0 = (S_1 + S_2)/(x * (x+1))$$

hence all data/data locator functions are mutually exclusive when $S_0$ is nonzero.

Note that single symbol data errors in data/data locators have exactly one of the error masks $e_0$ and $e_1$ nonzero, and hence single symbol data errors have each of $S_0$, $S_1$, and $S_2$ nonzero. Because $S_0$ through $S_2$ are linearly independent functions of $e_0$ and $e_1$, chipkill data/data errors have at least two of $S_0$ through $S_2$ nonzero. The $S_0$/synch chipkill locator function with no synch error coverage has $S_1=S_2=0$, so it and a data/data locator function cannot both be simultaneously true.

The $S_1/S_2$ locator function is true precisely when $S_0=0$. A data/data locator function is also true in this case when $0=S_0=e_0+e_1$ (i.e., precisely when $e_0=e_1$). Data/data locators when $e_0=e_1$ have $e_1=S_1=S_2$. Thus the $S_1/S_2$ locator and some data/data locator are both true only when $S_1=S_2$, and a data/data locator and the $S_1/S_2$ locator are both true only when $e_0=e_1$. These are the DUE cases for $S_1/S_2$ and data/data locators with no synch bit error coverage, which are 0.0015% of the possible chipkill errors. The remaining 99.9985% of chipkill errors are corrected accurately. This contrasts with 100% of chipkill errors being correctable in the standard (four check symbol) Reed-Solomon scheme. This DUE rate is very low, and is acceptable for most systems.

Figure 3:
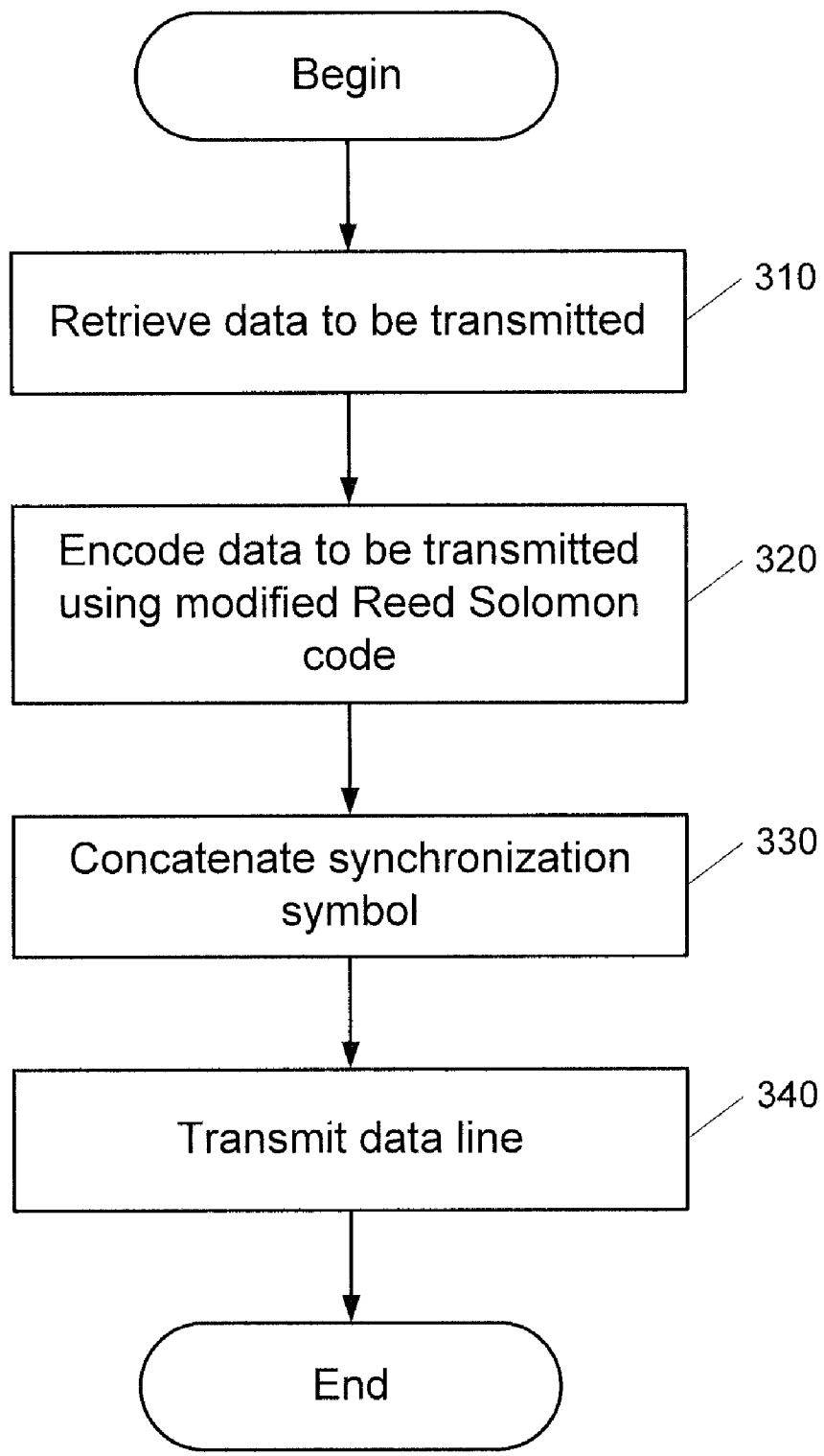
FIG. 3 is a flow diagram of one embodiment of a technique for encoding and transmitting a line of data having a synchronization symbol.

FIG. 3 is a flow diagram of one embodiment of a technique for encoding and transmitting a line of data having a synchronization symbol. The technique of FIG. 3 maybe utilized, for example, with a cache line that is transmitted from a processor that has operated on data stored in the cache line to another processor in a parallel computing environment. The synchronization symbol may be used to synchronize processing between the processors.

The data to be transmitted is retrieved, 310. The data may be read from memory, from a register, etc. In one embodiment, the data is a cache line; however, other data sizes may be supported. The data may be transmitted in response to a request from another processor or may be in response to the local processor transmitting to another processor.

The data to be transmitted is encoded using the modified Reed Solomon code, 320, as described above. In one embodiment, the resulting data symbols and check symbols may be stored in the cache line in the manner described with respect to FIG. 2. In alternate embodiments, other configurations and organizations may be utilized.

The synchronization symbol is concatenated to the data symbols and the check symbols, 330. In one embodiment, the synchronization symbol is the last symbol of the data line. In alternate embodiments, the synchronization symbol may be in a different location in the cache line. The data line is then transmitted, 340.

Figure 4:
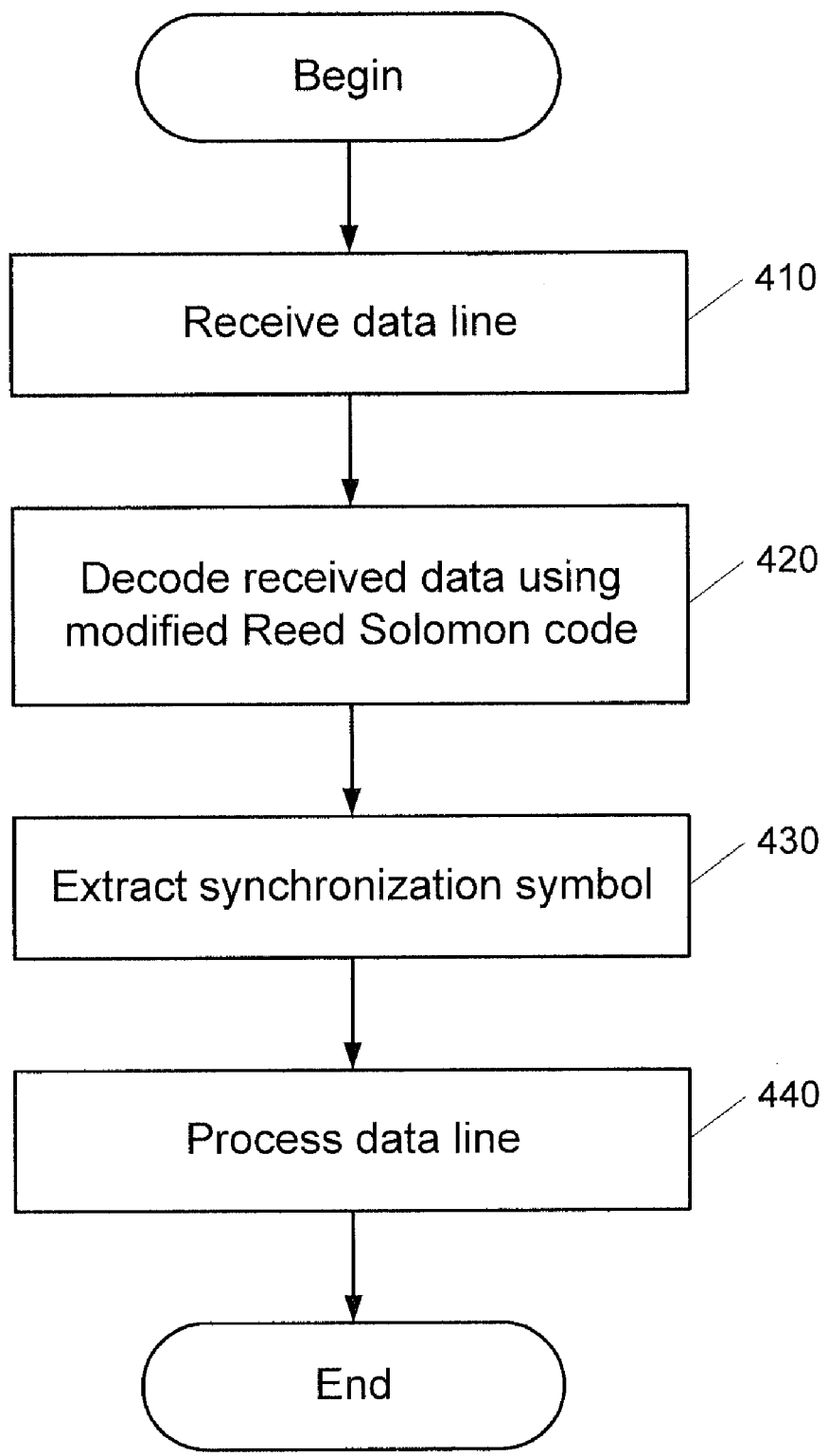
FIG. 4 is a flow diagram of one embodiment of a technique for receiving and decoding a line of data having a synchronization symbol.

FIG. 4 is a flow diagram of one embodiment of a technique for receiving and decoding a line of data having a synchronization symbol. The technique of FIG. 4 maybe utilized, for example, with a cache line that is received from a processor that has operated on data stored in the cache line by another processor in a parallel computing environment.

The data line having the synchronization symbol is received, 410. The received data line is decoded using the modified Reed Solomon code, 420. The synchronization symbol is extracted, 430, and the data is processed, 440.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   encoding a block of data using an error correcting code, wherein the resulting encoding includes three check symbols per 32 data symbols;
   generating at least one synchronization symbol corresponding to the data symbols;
   combining the data symbols, the check symbols and the at least one synchronization symbol;
   transmitting the combined data symbols, the check symbols and the at least one synchronization symbol.

2. The method of claim 1 wherein the error correcting code comprises a modified Reed Solomon code.

3. The method of claim 1 wherein each symbol comprises one or more bytes.

4. The method of claim 1 wherein the block of data comprises a cache line comprising 32 data symbols, three check symbols and one synchronization symbol.

5. The method of claim 1 wherein the combined data symbols, the check symbols and the at least one synchronization symbol are transmitted to and stored in one or more Dual Inline Memory Modules (DIMMs).

6. An apparatus comprising:
   a first processor;
   a second processor coupled with the first processor to operate in parallel with the first processor, the second processor to encode the block of data using an error correcting code, wherein the resulting encoding includes three check symbols per 32 data symbols, to generate at least one synchronization symbol corresponding to the data symbols for synchronization between the second processor and the first processor, to combine the data symbols, the check symbols and the at least one synchronization symbol, and to transmit the combined data symbols, the check symbols and the at least one synchronization symbol to the first processor.

7. The apparatus of claim 6 wherein the error correcting code comprises a modified Reed Solomon code.

8. The apparatus of claim 6 wherein each symbol comprises one or more bytes.

9. The apparatus of claim 6 wherein the block of data comprises a cache line comprising 32 data symbols, three check symbols and one synchronization symbol.

10. The apparatus of claim 6 wherein the combined data symbols, the check symbols and the at least one synchronization symbol are transmitted to and stored in one or more Dual Inline Memory Modules (DIMMs).

11. An article comprising a computer-readable medium having stored thereon instructions that, when executed, cause one or more processors to:
    encode a block of data using an error correcting code, wherein the resulting encoding includes three check symbols per 32 data symbols;
    generate at least one synchronization symbol corresponding to the data symbols;
    combine the data symbols, the check symbols and the at least one synchronization symbol;
    transmit the combined data symbols, the check symbols and the at least one synchronization symbol.

12. The article of claim 11 wherein the error correcting code comprises a modified Reed Solomon code.

13. The article of claim 11 wherein each symbol comprises one or more bytes.

14. The article of claim 11 wherein the block of data comprises a cache line comprising 32 data symbols, three check symbols and one synchronization symbol.

15. The article of claim 11 wherein the combined data symbols, the check symbols and the at least one synchronization symbol are transmitted to and stored in one or more Dual Inline Memory Modules (DIMMs).

* * * * *